United States Patent
Lebonheur et al.

(10) Patent No.: US 6,908,789 B1
(45) Date of Patent: Jun. 21, 2005

(54) METHOD OF MAKING A MICROELECTRONIC ASSEMBLY

(75) Inventors: Vassoudevane Lebonheur, Tempe, AZ (US); Gregory J. Lemke, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/737,379

(22) Filed: Dec. 15, 2003

(51) Int. Cl.$^7$ .......................... H01L 21/44; H01L 21/48; H01L 21/50
(52) U.S. Cl. ...................................... 438/106
(58) Field of Search ........................... 438/106, 46, 51, 438/55, 64, 107, 108, 110, 122

(56) References Cited

U.S. PATENT DOCUMENTS 6,180,696 B1 * 1/2001 Wong et al. ................ 523/457
6,673,649 B1 * 1/2004 Hiatt et al. ................. 438/105
6,794,225 B2 * 9/2004 Manepalli et al. .......... 438/127

* cited by examiner

Primary Examiner—David Nhu
(74) Attorney, Agent, or Firm—Blakely, Sokoloff, Taylor & Zafman LLP

(57) ABSTRACT

A method of making a microelectronic assembly is provided. Wetting and flow characteristics of a no-low underfill material are improved by preheating the no-flow underfill material. In one embodiment, the no-flow underfill material is preheated in a dispensing apparatus before being dispensed on a substrate. A die is then placed on the substrate, whereafter interconnection elements between the die and the substrate are reflowed and the no-flow underfill material is cured. In another embodiment, the no-flow underfill material is preheated after a die is placed on a substrate with the no-flow underfill material between the die and the substrate. In a further embodiment, a no-flow underfill material is dispensed on a die, whereafter a substrate is placed on the die with the no-flow underfill material between the substrate and the die.

18 Claims, 6 Drawing Sheets

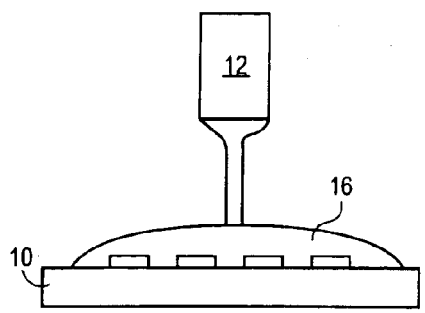
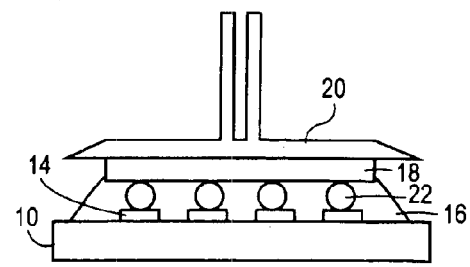
FIG. 3A
FIG. 3B
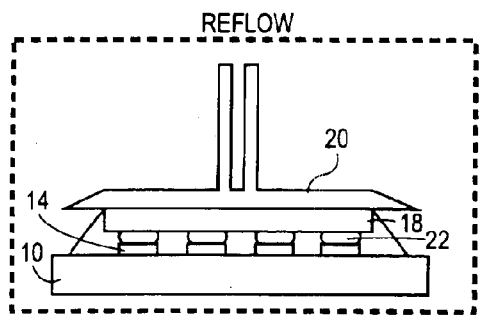
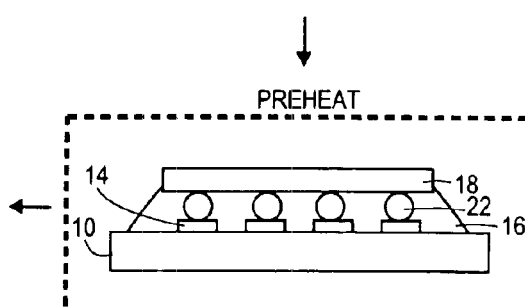
FIG. 3C
FIG. 3D
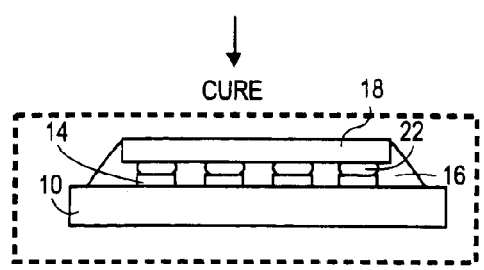
FIG. 3E

METHOD OF MAKING A MICROELECTRONIC ASSEMBLY

BACKGROUND OF THE INVENTION

1). Field of the Invention

This invention relates to a method of making a microelectronic assembly.

2). Discussion of Related Art

Integrated circuits are usually manufactured in and on semiconductor substrates that are subsequently "diced" or "singulated" into individual microelectronic dies. Interconnection elements are often formed on a surface of each microelectronic die before the microelectronic dies are singulated.

The interconnection elements are then placed on substrate terminals of a carrier substrate. The entire assembly is then usually placed in a reflow oven which melts the interconnection elements. Subsequent cooling of the interconnection elements causes attachment of the interconnection elements to the substrate terminals. The interconnection elements are thus soldered to the substrate terminals. A solder flux is usually provided to remove metal oxides from the interconnection elements while being soldered. The solder flux is subsequently washed out.

When an integrated circuit in such a die is operated, the integrated circuit generates heat which spreads to the remainder of the microelectronic die and to the substrate. The microelectronic die is usually made of silicon and the substrate of another material, typically an organic polymer material. Differences in coefficients of thermal expansion cause differences in expansion rates of the microelectronic die and the substrate when the heat is generated by operating the circuit, or when the assembly is manufactured. The relative expansion between the microelectronic die and the substrate creates stresses that are especially large at interfaces between the interconnection elements and the substrate terminals.

An underfill material is often provided around the microelectronic die which flows into a space between the microelectronic die and the substrate under capillary action. The underfill material is then heated to a temperature and for a period of time sufficient to cure the underfill material. Curing of the underfill material hardens the underfill material. The hardened underfill material can distribute stresses due to differences in coefficients of thermal expansion, and so prevent the interconnection elements from shearing off the substrate terminals.

No-flow underfill materials are often provided to replace both the solder flux and the conventional underfill material. A no-flow underfill material can remove metal oxides when the interconnection elements are soldered and can subsequently be cured and hardened.

No-flow underfill materials typically do not have the good wetting and flow characteristics of conventional capillary underfill materials. The substrate is usually heated before the no-flow underfill material is dispensed thereon. The substrate then, in turn, heats the underfill material, which improves the wetting characteristics of the underfill material.

BRIEF DESCRIPTION OF THE DRAWINGS

The invention is further described by way of examples with reference to the accompanying drawings wherein:

FIGS. 3A to 3E are side views of components and apparatus that are used for making a microelectronic assembly according to another embodiment of the invention;

DETAILED DESCRIPTION OF THE INVENTION

A method of making a microelectronic assembly is provided. Wetting and flow characteristics of a no-flow underfill material are improved by preheating the no-flow underfill material. In one embodiment, the no-flow underfill material is preheated in a dispensing apparatus before being dispensed on a substrate. A die is then placed on the substrate, whereafter interconnection elements between the die and the substrate are reflowed and the no-flow underfill material is cured. In another embodiment, the no-flow underfill material is preheated after a die is placed on a substrate with the no-flow underfill material between the die and the substrate. In a further embodiment, a no-flow underfill material is dispensed on a die, whereafter a substrate is placed on the die with the no-flow underfill material between the substrate and the die.

Figure 1A:
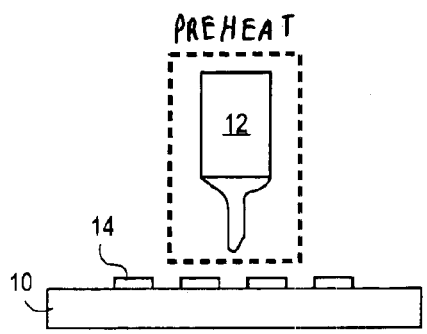
FIGS. 1A to 1E are side views of components and apparatus that are used for a method of making a microelectronic assembly according to one embodiment of the invention.
Figure 1B:
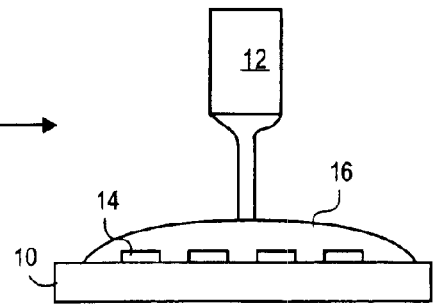
Figure 1D:
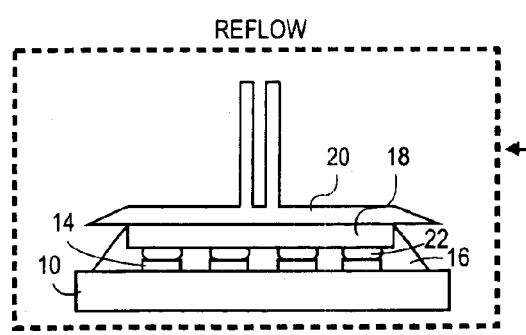
Figure 1C:
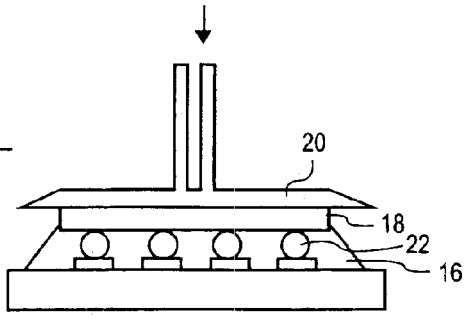
Figure 1E:
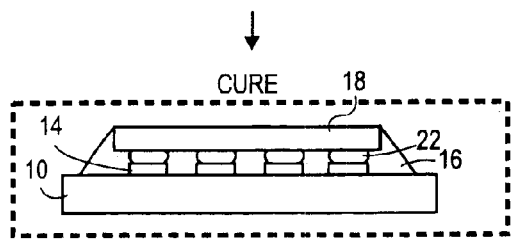
Figure 2:
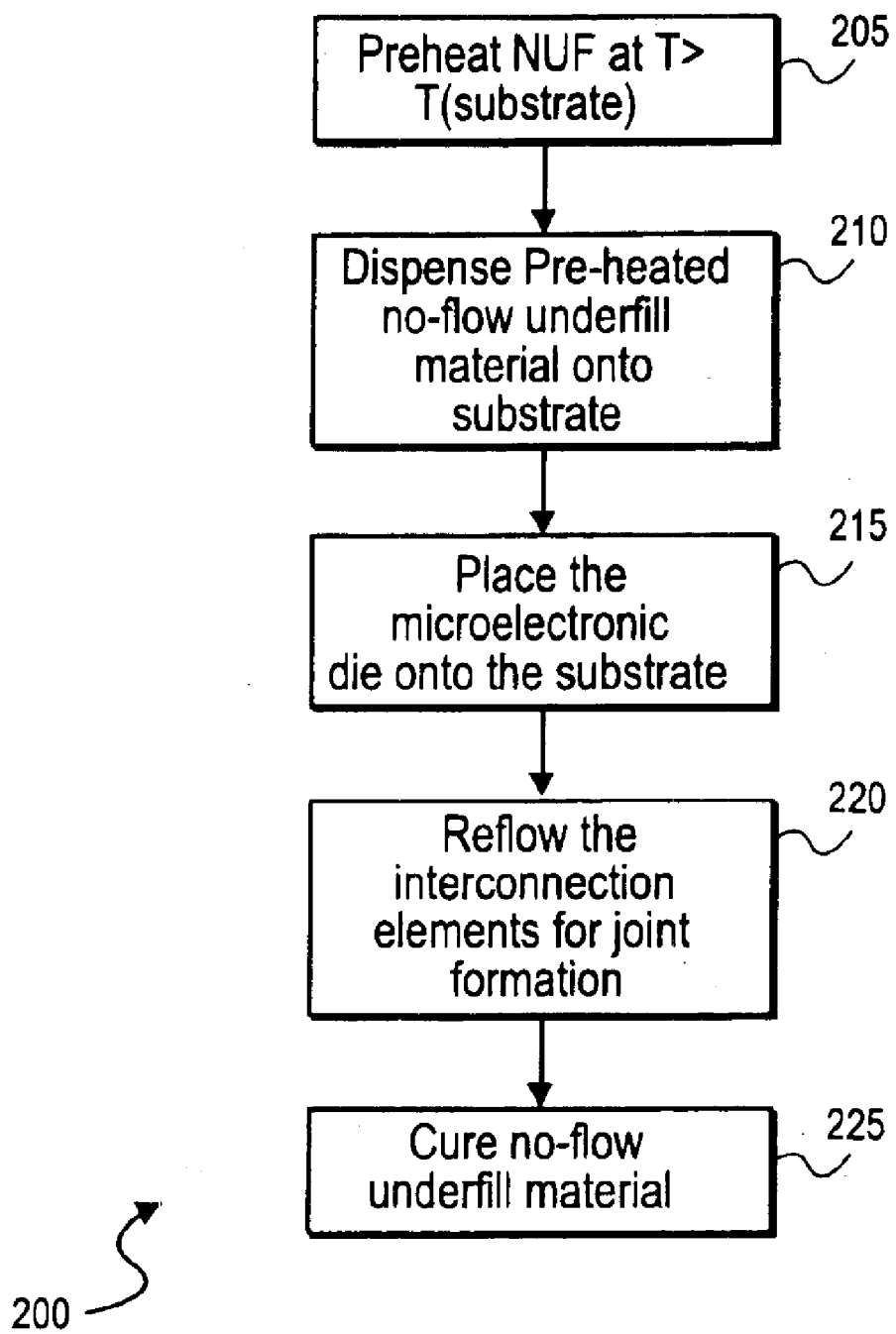
FIG. 2 is a flowchart corresponding to FIGS. 1A to 1E.

FIGS. 1A to 1E and corresponding FIG. 2 illustrate a method (200) of making a microelectronic assembly according to one embodiment of the invention.

As illustrated in FIG. 1A, a substrate 10 and a dispensing apparatus 12 are provided. The substrate 10 is made of a dielectric material and has metal lines and metal planes formed therein and thereon. Substrate terminals 14 are formed on an upper surface of the substrate 10.

The dispensing apparatus 12 is filled with a no-flow underfill material. The no-flow underfill material is preheated while in the dispensing apparatus 12 to a temperature above the temperature of the substrate 10 (205). For purposes of illustration, a dashed line is provided in the drawings when a component or components are heated. The no-flow underfill material in the dispensing apparatus 12 is typically preheated to a temperature of approximately 60° C. In other embodiments, a no-flow underfill material may be preheated to a temperature between 30° C. and 120° C. The purpose of preheating the no-flow underfill material is to improve its wetting and flow characteristics. In general, the viscosity of the no-flow underfill material is lowered and its ability to adhere to surfaces is increased when it is heated.

As illustrated in FIG. 1B, the preheated no-flow underfill material, represented with reference numeral 16, is subsequently dispensed onto an upper surface of the substrate 10 (210). The no-flow underfill material 16 is typically at approximately 60° C. and the substrate 10 at approximately 22° C. There is thus a temperature difference of approximately 38° C. between the no-flow underfill material 16 and the substrate 10. In another embodiment, the temperature difference may be at least 10° C. Because the no-flow underfill material 16 is heated, it adheres and spreads easily over an upper surface of the substrate 10 and the substrate terminals 14.

FIG. 1C illustrates further construction of the microelectronic assembly. A microelectronic die 18 is provided and is held by a chuck 20. An integrated circuit is formed in the microelectronic die 18 and a plurality of interconnection elements 22 are formed on terminals on a lower surface of the microelectronic die 18. In the present example, the interconnection elements 22 are formed by a process generally known as controlled collapse chip connect (C4). Interconnection elements 22 are made of metals or metal alloys. Examples of metals or metal alloys that the interconnection elements 22 may be made of include Sn with a melting temperature of 232° C., SnAgCu with a melting temperature of 217° C., SnAg with a melting temperature of 221° C., SnCu with a melting temperature of 227° C., or SnPb eutectic with a melting temperature of 183° C. The chuck 20 is used to place the microelectronic die 18 on the substrate 10 (215), the interconnection elements 22 are inserted into the no-flow underfill material 16, and each interconnection element 22 comes into contact with a respective one of the substrate terminals 14. The no-flow underfill material 16 is still at approximately 60° C. The microelectronic die 18 and the interconnection elements 22 are at a temperature of approximately 22° C. Because the no-flow underfill material 18 has been preheated, it wets more easily over surfaces of the microelectronic die 18 and the interconnection elements 22.

As illustrated in FIG. 1D, the interconnection elements 22 are subsequently reflowed for purposes of joint formation between the interconnection elements 22 and in substrate terminals 14 (220). The interconnection elements 22 are heated to above their melting temperatures, and subsequently allowed to cool. The chuck 20 holds the microelectronic die 18 so that the microelectronic die 18 does not collapse onto the substrate 10 when the interconnection elements 22 are being heated. The chuck 20 also provides a small downward force in a direction of the substrate 10. The interconnection elements.22 are thus soldered to the substrate terminals 14. The no-flow underfill material 16 acts as a solder flux that removes metal oxides from the interconnection elements 22 when they are heated. A more reliable joint is thereby formed between each interconnection element 22 and a respective substrate terminal 14.

Reference is now made to FIG. 1E. The chuck 20 illustrated in Figure 1D has been removed from the microelectronic die 18. The entire assembly is then heated to a temperature and for a period of time sufficient to cure the no-flow underfill material 16 (225). Curing of the no-flow underfill material 16 hardens the no-flow underfill material 16. When the integrated circuit in the microelectronic die is operated, heat is generated by the integrated circuit and distributed throughout the entire assembly. Stresses are created due to differences in coefficients of thermal expansion of the microelectronic die 18 and the substrate. These stresses are particularly large on the interconnection elements 22 and may tend to shear the interconnection elements 22 from the substrate terminals 14. The hardened no-flow underfill material 16 distributes stresses due to differences in coefficients of thermal expansion between the microelectronic die 18 and the substrate 10.

Figure 4:
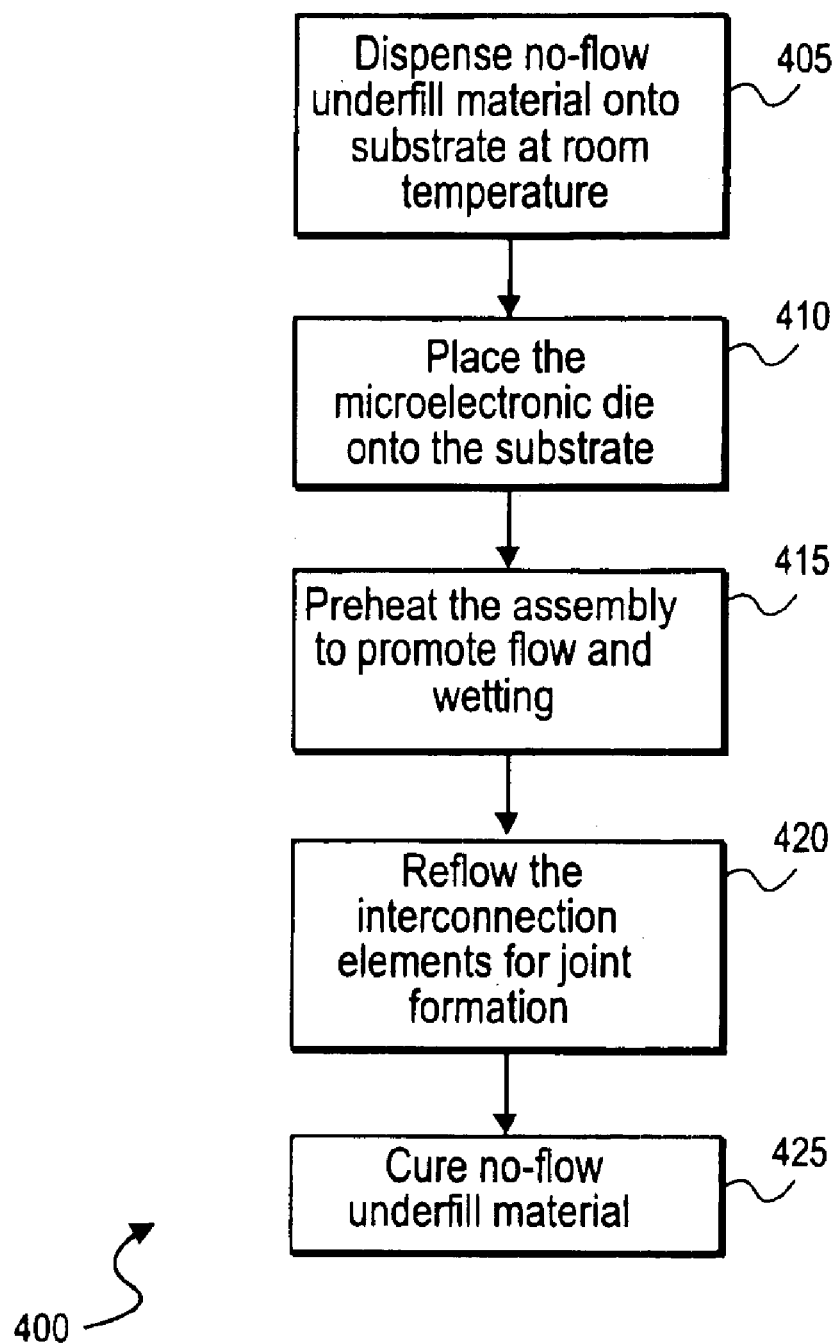
FIG. 4 is a flowchart corresponding to FIGS. 3A to 3E.

FIGS. 3A to 3E and corresponding FIG. 4 illustrate a method (400) of making a microelectronic assembly according to another embodiment of the invention. As illustrated in FIG. 3A, a no-flow underfill material 16 is dispensed out of a dispensing apparatus 12 onto a substrate 10 (405). The no-flow underfill material 16 and the substrate 10 are both at approximately 22° C. As illustrated in FIG. 3B, a chuck 20 is used to place a microelectronic die 18 onto a substrate 10 (410). Interconnection elements 22 come into contact with substrate terminals 14 on the substrate 10. The microelectronic die 18 and the interconnection elements 22 are also at approximately 22° C.

Reference is now made to FIG. 3D. The chuck 20 of FIG. 3D is removed from the microelectronic die 18. The entire assembly is then preheated to promote flow and wetting of the no-flow underfill material (415). The assembly is heated to approximately 60° C. In another embodiment, the assembly may be heated to a temperature between 30° C. and 120° C.

Referring to FIG. 3C, the microelectronic die 18 is again held by the chuck 20 and the entire assembly is heated to above the melting temperature of the interconnection elements 22 to reflow the interconnection elements for joint formation (420). Subsequent cooling of the assembly causes solidification of the interconnection elements 22 and attachment of the interconnection elements 22 to the substrate terminals 14.

As illustrated in FIG. 3E, the chuck 20 of FIG. 3C is removed from the microelectronic die 18. As also illustrated, the entire assembly is then heated to a temperature and for a period of time sufficient to cure the no-flow underfill material 16 (425).

Figure 5A:
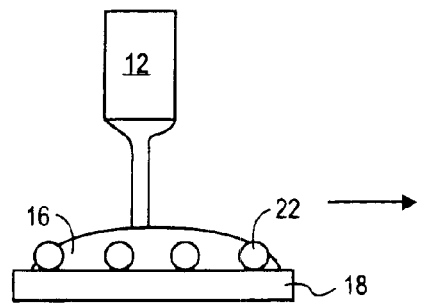
FIGS. 5A to 5E are side views of components and apparatus that are used for making a microelectronic assembly according to a further embodiment of the invention.
Figure 5B:
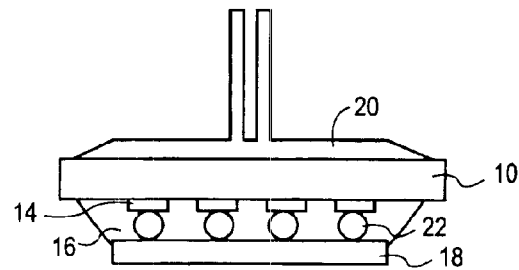
Figure 5D:
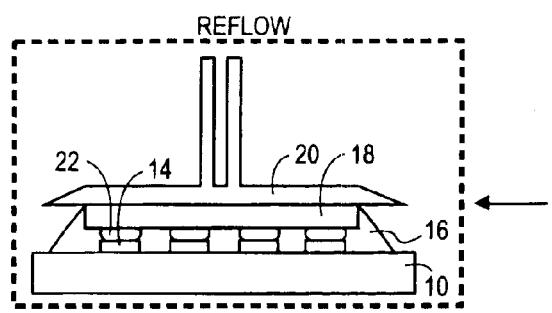
Figure 5C:
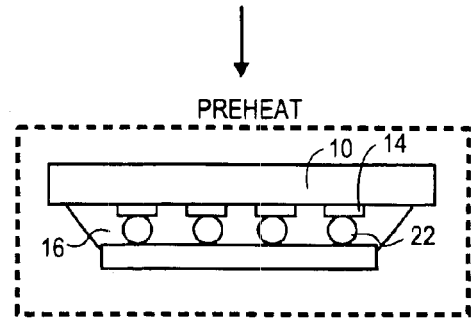
Figure 5E:
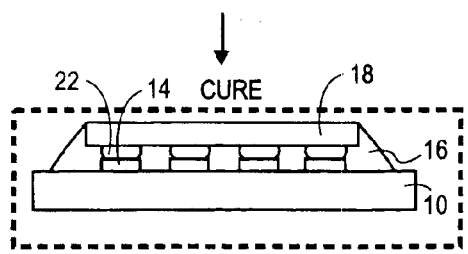
Figure 6:
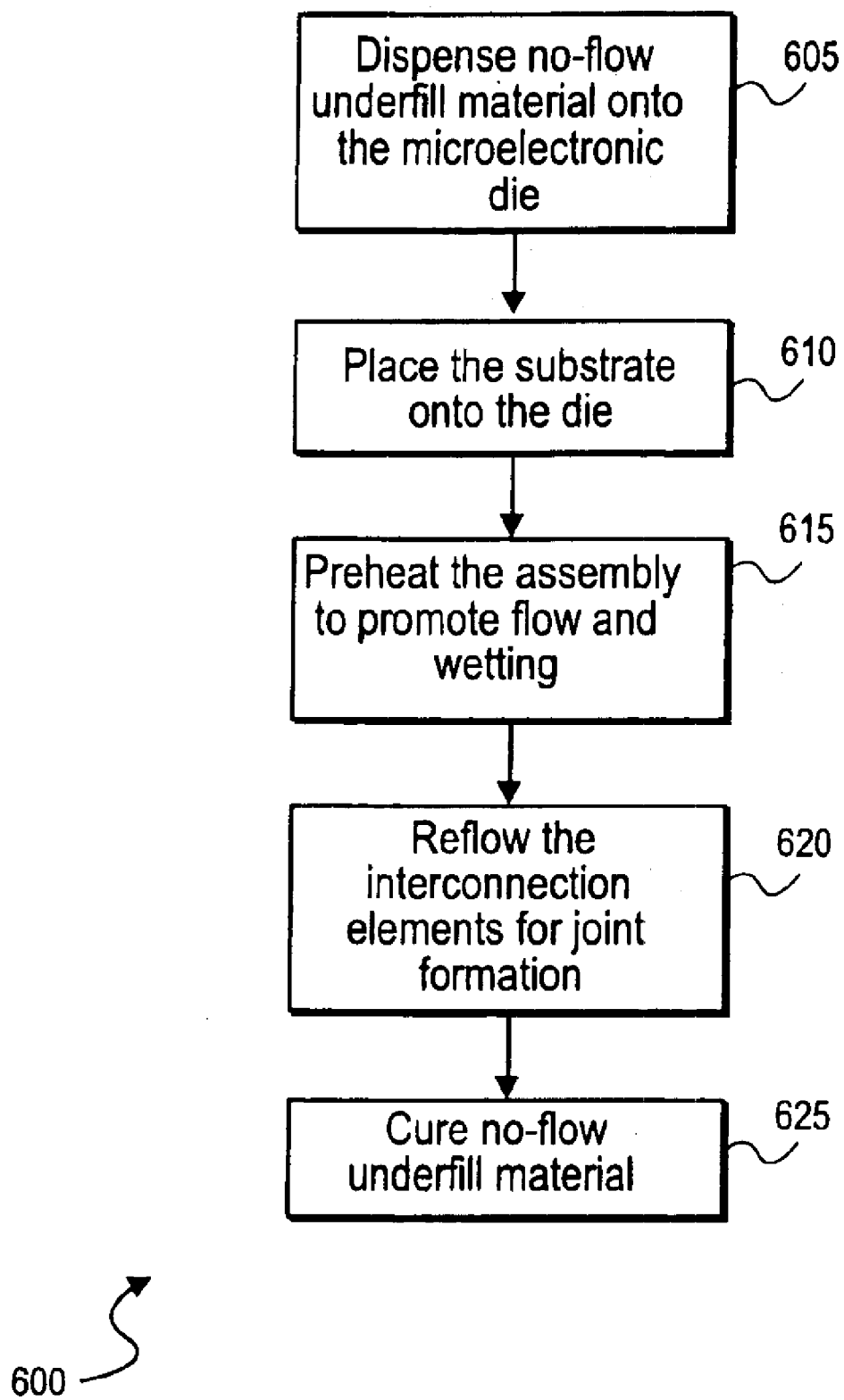
FIG. 6 is a flowchart corresponding to FIGS. 5A to 5E.

FIGS. 5A to 5E and corresponding FIG. 6 illustrate a method 600 of making a microelectronic assembly according to a further embodiment of the invention. As illustrated in FIG. 5A, a no-flow underfill material 16 is dispensed onto a surface of a microelectronic die 18 (605). The noflow underfill material 16 is dispensed out of a dispensing apparatus 12 at approximately 22° C. onto the die 18 which is also at approximately 22° C. The no-flow underfill material 16 is then located between interconnection elements 22 on the microelectronic die 18.

As illustrated in FIG. 5B, a substrate 10 is placed on the die 18 (610). A plurality of substrate terminals 14 are formed on the substrate 10. Each substrate terminal 14 comes into contact with a respective one of the interconnection elements 22. A chuck 20 is used to move the substrate 10 onto the die 18.

Reference is now made to FIG. 5C. The chuck 20 of FIG. 5B is removed. The entire assembly is subsequently preheated to promote flow and wetting of the underfill material 16 (615). The preheat temperature is approximately 60° C. In another embodiment, the preheat temperature may be between 30° C. and 120° C.

Reference is now made to FIG. 5D. The assembly of FIG. 5C is flipped so that the microelectronic die 18 is at the top. The chuck 20 is then connected to the microelectronic die 18. The entire assembly is then heated to a temperature above the melting temperatures of the interconnection elements 22 to cause reflow of the interconnection elements for joint formation (620). The chuck 20 remains connected to the microelectronic die 18 until the assembly is allowed to cool to a temperature wherein the interconnection elements 22 are again solid.

Reference is now made to FIG. 5E. The chuck 20 of FIG. 5D is subsequently removed. The entire assembly is then heated to a temperature and for a time sufficient to cure the no-flow underfill material (625).

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A method of making a microelectronic assembly, comprising:

improving wetting and flow characteristics of a no-flow underfill material by preheating the no-flow underfill material;

assembling a construction including a carrier substrate, a microelectronic die having an integrated circuit, and the no-flow underfill material between the carrier substrate and the microelectronic die, the wetting characteristics having been improved before the construction, including the carrier substrate, the microelectronic die and the no-flow underfill material, is assembled;

reflowing interconnection elements between the carrier substrate and the microelectronic die of the construction by heating and subsequently allowing the interconnection elements to cool; and curing the no-flow underfill material of the construction by heating the no-flow underfill material for a period of time sufficient to harden the no-flow underfill material.

2. The method of claim 1, wherein the no-flow underfill material is preheated before coming into contact with either the microelectronic die or the carrier substrate.

3. The method of claim 2, wherein the construction is assembled by dispensing the no-flow underfill material on the carrier substrate and subsequently locating the microelectronic die adjacent the no-flow underfill material.

4. The method of claim 3, further comprising:
holding the microelectronic die with a chuck while the interconnection elements are being reflowed; and
releasing the chuck from the microelectronic die.

5. The method of claim 2, wherein the construction is assembled by dispensing the no-flow underfill material on the microelectronic die and subsequently locating the carrier substrate adjacent the no-flow underfill material.

6. The method of claim 5, further comprising:
holding the microelectronic die with a chuck while the interconnection elements are being reflowed; and
releasing the chuck from the microelectronic die.

7. The method of claim 1, wherein the no-flow underfill material is preheated at a temperature between 30° C. and 120° C.

8. The method of claim 7, wherein the interconnection elements are reflowed at a temperature of at least 18320 C.

9. A method of making a microelectronic assembly, comprising:
dispensing a no-flow underfill material on a microelectronic die having an integrated circuit;
subsequently locating a carrier substrate adjacent the no-flow underfill material;
reflowing interconnection elements between the carrier substrate and the microelectronic die by heating and subsequently allowing the interconnection elements to cool; and curing the no-flow underfill material by heating the no-flow underfill material for a period of time sufficient to harden the no-flow underfill material.

10. The method of claim 9, further comprising:
preheating the no-flow underfill material before dispensing the no-flow underfill material on the microelectronic die.

11. The method of claim 9, further comprising:
preheating the underfill material after the carrier substrate is located adjacent the no-flow underfill material but before the interconnection elements are reflowed.

12. The method of claim 9, further comprising:
holding the microelectronic die with a chuck while the interconnection elements are being reflowed; and
releasing the chuck from the microelectronic die.

13. The method of claim 9, wherein the no-flow underfill material is preheated at a temperature between 30° C. and 120° C.

14. The method of claim 13, wherein the interconnection elements are reflowed at a temperature of at least 183° C.

15. A method of making a microelectronic assembly, comprising:
assembling a construction including a carrier substrate, a microelectronic die having an integrated circuit, interconnection elements between the carrier substrate and the microelectronic die, and a no-flow underfill material between the interconnection elements;
subsequently heating the no-flow underfill material to a temperature below a reflowing temperature of the interconnection elements;
subsequently connecting the microelectronic die with a chuck; and
reflowing the interconnection elements by heating the interconnection elements while the microelectronic die is held with the chuck.

16. The method of claim 15, wherein the construction is assembled by dispensing the no-flow underfill material on the carrier substrate.

17. The method of claim 15, wherein the no-flow underfill material is preheated at a temperature between 30° C. and 120° C.

18. The method of claim 17, wherein the interconnection elements are reflowed at a temperature of at least 183° C.

* * * * *

UNITED STATES PATENT AND TRADEMARK OFFICE
CERTIFICATE OF CORRECTION

PATENT NO. : 6,908,789 B1
DATED : June 21, 2005
INVENTOR(S) : Lebonheur et al.

It is certified that error appears in the above-identified patent and that said Letters Patent is hereby corrected as shown below:

Title page,
Item [57], ABSTRACT,
Line 2, delete "no-low" and insert -- no-flow --.

Column 3,
Line 33, delete ".22" and insert -- 22 --.

Column 4,
Line 25, delete "noflow" and insert -- no-flow --.

Column 5,
Line 41, delete "18320 C" and insert -- 183° C --.

Signed and Sealed this

Twentieth Day of September, 2005

JON W. DUDAS
*Director of the United States Patent and Trademark Office*